(12) United States Patent
Breymesser et al.

(10) Patent No.: US 9,981,844 B2
(45) Date of Patent: *May 29, 2018

(54) METHOD OF MANUFACTURING SEMICONDUCTOR DEVICE WITH GLASS PIECES

(75) Inventors: Alexander Breymesser, Villach (AT); Andre Brockmeier, Villach (AT); Carsten von Koblinski, Bodensdorf (AT); Francisco Javier Santos Rodriguez, Villach (AT)

(73) Assignee: Infineon Technologies AG, Neubiberg (DE)

( * ) Notice: Subject to any disclaimer, the term of this patent is extended or adjusted under 35 U.S.C. 154(b) by 761 days.

This patent is subject to a terminal disclaimer.

(21) Appl. No.: 13/415,376

(22) Filed: Mar. 8, 2012

(65) Prior Publication Data

US 2013/0237034 A1    Sep. 12, 2013

(51) Int. Cl.
  *H01L 21/78*  (2006.01)
  *B32B 3/30*   (2006.01)
  (Continued)

(52) U.S. Cl.
  CPC .......... *B81C 99/008* (2013.01); *C03B 11/082* (2013.01); *C03B 40/02* (2013.01);
  (Continued)

(58) Field of Classification Search
  CPC . H01L 2224/48227; H01L 2224/48465; H01L 2224/48091; H01L 2924/00;
  (Continued)

(56) References Cited

U.S. PATENT DOCUMENTS 4,830,655 A * 5/1989 Franek et al. .................. 65/286
4,842,633 A * 6/1989 Kuribayashi .......... B22F 5/007
                                                 216/24
(Continued)

FOREIGN PATENT DOCUMENTS

DE     3719200 A1    12/1988
DE    19956654 A1     6/2001
(Continued)

OTHER PUBLICATIONS

Wolf et al., Silicon Processing for the VLSI Era, vol. 1—Process Technology, Sunset Beach, CA: Lattice Press, 1986, pp. 531-532.*

(Continued)

*Primary Examiner* — Mary Wilczewski
(74) *Attorney, Agent, or Firm* — Murphy, Bilak & Homiller, PLLC (57) ABSTRACT

A source material, which is based on a glass, is arranged on a working surface of a mold substrate. The mold substrate is made of a single-crystalline material. A cavity is formed in the working surface. The source material is pressed against the mold substrate. During pressing a temperature of the source material and a force exerted on the source material are controlled to fluidify source material. The fluidified source material flows into the cavity. Re-solidified source material forms a glass piece with a protrusion extending into the cavity. After re-solidifying, the glass piece may be bonded to the mold substrate. On the glass piece, protrusions and cavities can be formed with slope angles less than 80 degrees, with different slope angles, with different depths and widths of 10 micrometers and more.

6 Claims, 7 Drawing Sheets

(51) Int. Cl.
*C03B 19/00* (2006.01)
*C03B 23/02* (2006.01)
*B81C 99/00* (2010.01)
*C03B 40/02* (2006.01)
*C03B 11/08* (2006.01)
*H01L 23/31* (2006.01)
*H01L 21/56* (2006.01)
*H01L 23/29* (2006.01)
*G02B 6/12* (2006.01)

(52) U.S. Cl.
CPC .......... *H01L 21/56* (2013.01); *H01L 23/3178* (2013.01); *B81C 2201/034* (2013.01); *C03B 2215/07* (2013.01); *C03B 2215/79* (2013.01); *G02B 2006/12038* (2013.01); *H01L 23/291* (2013.01); *H01L 2924/0002* (2013.01); *Y10T 428/24479* (2015.01)

(58) Field of Classification Search
CPC .......... H01L 2924/0002; C03B 11/082; C03B 2215/79; B29C 33/3842; B29C 33/424
USPC .................................................. 398/135, 138
See application file for complete search history.

(56) References Cited

U.S. PATENT DOCUMENTS

| | | | |
|---|---|---|---|
| 5,213,600 A | 5/1993 | Greschner et al. | |
| 5,378,289 A * | 1/1995 | Noguchi | H01L 31/0236 117/8 |
| 5,436,764 A * | 7/1995 | Umetani | B29C 43/021 264/1.21 |
| 5,773,874 A | 6/1998 | Einthoven | |
| 6,121,173 A * | 9/2000 | Terashi | 501/4 |
| 6,151,917 A | 11/2000 | Hibino et al. | 65/169 |
| 6,305,194 B1 | 10/2001 | Budinski et al. | |
| 6,432,328 B2 | 8/2002 | Hamanaka | 264/1.36 |
| 6,433,471 B1 * | 8/2002 | Khan et al. | 313/483 |
| 6,951,119 B1 | 10/2005 | Quenzer et al. | |
| 6,997,019 B2 * | 2/2006 | Kawata | C03B 11/08 65/102 |
| 7,129,163 B2 * | 10/2006 | Sherrer | G02B 6/4201 438/637 |
| 7,309,174 B2 * | 12/2007 | Farr | G02B 6/4206 385/53 |
| 7,611,648 B2 * | 11/2009 | Wolfing | B29C 43/021 264/2.4 |
| 8,099,982 B2 * | 1/2012 | Takagi et al. | 65/305 |
| 8,294,996 B2 * | 10/2012 | Ueno | B28B 11/003 264/1.21 |
| 8,369,709 B2 * | 2/2013 | Guo | H01S 5/4025 385/92 |
| 9,027,237 B2 * | 5/2015 | Pawlowski | C03B 11/082 29/832 |
| 9,219,020 B2 * | 12/2015 | Breymesser | H01L 23/3178 |
| 2002/0109069 A1 * | 8/2002 | Yamamoto | C03C 27/00 249/134 |
| 2004/0123628 A1 * | 7/2004 | Stoehr | C03B 11/08 65/102 |
| 2005/0013562 A1 * | 1/2005 | Tatehata | G02B 6/4201 385/93 |
| 2005/0110157 A1 * | 5/2005 | Sherrer | G02B 6/4201 257/776 |
| 2005/0185900 A1 * | 8/2005 | Farr | G02B 6/4206 385/93 |
| 2005/0274145 A1 * | 12/2005 | Aitken | C03B 11/082 65/64 |
| 2006/0038206 A1 | 2/2006 | Shimoyama et al. | |
| 2006/0073626 A1 * | 4/2006 | Shimizu | C03B 11/082 438/48 |
| 2006/0090512 A1 * | 5/2006 | Fujimoto | C03B 11/08 65/29.19 |
| 2006/0130527 A1 * | 6/2006 | Tanaka et al. | 65/374.13 |
| 2009/0194666 A1 * | 8/2009 | Takamoto | 249/135 |
| 2009/0202251 A1 * | 8/2009 | Shibayama | A61B 5/0261 398/138 |
| 2009/0243126 A1 * | 10/2009 | Washiya | B29C 35/0888 264/2.5 |
| 2010/0265597 A1 * | 10/2010 | Shyu | C03B 11/08 359/797 |
| 2011/0064418 A1 * | 3/2011 | Wang | G02B 6/4201 398/139 |
| 2011/0200288 A1 * | 8/2011 | Poole | G02B 6/4248 385/94 |
| 2012/0142144 A1 * | 6/2012 | Taheri | B81B 7/007 438/107 |
| 2012/0212818 A1 * | 8/2012 | Takano | G02B 5/1852 359/558 |
| 2013/0234297 A1 * | 9/2013 | Breymesser | H01L 23/3178 257/623 |
| 2013/0237034 A1 * | 9/2013 | Breymesser | C03B 40/02 438/460 |
| 2013/0313744 A1 * | 11/2013 | Maruyama | G03F 7/0002 264/40.1 |
| 2014/0208801 A1 * | 7/2014 | Takano | G02B 5/1852 65/66 |
| 2014/0224579 A1 * | 8/2014 | Balascak | E04G 21/328 182/3 |
| 2014/0283553 A1 * | 9/2014 | Tomisaka | C03B 11/082 65/61 |
| 2015/0077839 A1 * | 3/2015 | Mizukane | G02B 7/022 359/355 |
| 2015/0225275 A1 * | 8/2015 | Tomisaka | C03B 11/082 65/61 |
| 2015/0247959 A1 * | 9/2015 | Sannokyou | C03B 11/08 359/619 |
| 2015/0279930 A1 * | 10/2015 | Breymesser | H01L 29/0615 257/487 |

FOREIGN PATENT DOCUMENTS

| | | | | |
|---|---|---|---|---|
| DE | 102005038152 A1 | 3/2006 | | |
| DE | 102006009961 A1 | 10/2006 | | |
| DE | 10 2005 063 276 A1 * | 7/2007 | ............ | C03B 23/00 |
| JP | 2007-127440 * | 5/2007 | ............ | H01L 29/84 |
| WO | WO 2013/027808 * | 2/2013 | ............ | C03B 11/082 |
| WO | WO 2013/148660 A1 * | 10/2013 | ............ | C03B 23/02 |

OTHER PUBLICATIONS

"Foturan—a photostructurable glass." pp. 1-3. mikroglas chemtech GmbH. Mainz, Germany.

* cited by examiner

METHOD OF MANUFACTURING SEMICONDUCTOR DEVICE WITH GLASS PIECES

BACKGROUND

Glass compression molding uses appropriate molds to form for example optical components such as lenses. Dry etching, wet etching, mechanical processes or laser ablation are used to form cavities in glass substrates.

It is desirable to provide new methods of forming glass pieces with patterned surfaces.

SUMMARY

According to an embodiment of a method of manufacturing a glass piece, a source material that is based on a glass is arranged in contact with a working surface of a mold substrate. The mold substrate is made of a single-crystalline material. A cavity is formed in the working surface of the mold substrate. The source material and the mold substrate are pressed against each other. A temperature of the source material and a force exerted on the source material are controlled such that fluidified source material flows into the cavity in the mold substrate.

According to another method of manufacturing a glass piece, a source material based on a glass is arranged in contact with a working surface of a mold substrate which is made of a single-crystalline material. The working surface is provided with at least one protrusion. The source material and the mold substrate are pressed against each other, wherein a temperature of the source material and a force exerted on the source material are controlled such that fluidified source material enwraps the protrusion.

According to an embodiment of a glass piece, a glass piece comprises a patterned surface on which at least one cavity is formed which has a slope angle with regard to the patterned surface of less than 80 degrees.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and intended advantages will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

Figure 1A:
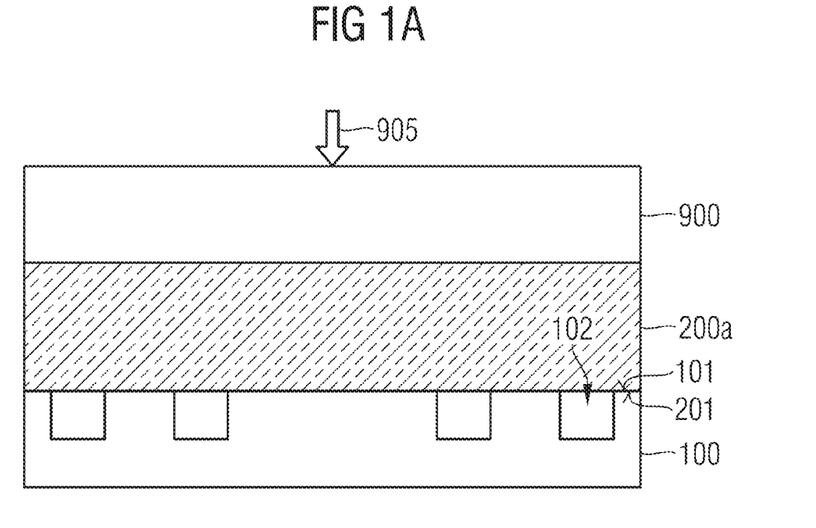
FIG. 1A is a schematic cross-sectional view of an arrangement including a mold substrate, a source material based on a glass and a plate for exerting a force on the source material for illustrating the manufacturing of a glass piece according to an embodiment using a mold substrate with cavities having a slope angle of 90 degrees.

FIG. 1A shows a mold substrate 100 which is made of a single-crystalline material, for example a semiconductor single-crystalline material. According to an embodiment, the single-crystalline material is single-crystalline silicon. One or more cavities 102 are formed in a working surface 101 of the mold substrate 100 and extend from the working surface 101 into the mold substrate 100. The cavities 102 may be formed by isotropic etch processes, anisotropic etch processes, by methods using laser beams or by mechanical processes. For example, different crystal surfaces of the single-crystalline material can be etched at different speeds such that slope angles of the cavities can be precisely adjusted to, for example 45 degrees.

A source material 200a is provided in contact with the working surface 101 of the mold substrate 100. The source material 200a is based on a glass. According to an embodiment, the source material 200a exhibits a glass transition and fluidifies when the temperature of the source material 200a exceeds the glass transition temperature. The source material 200a may be soda-lime glass, undoped silica, or silica doped with at least one dopant, the dopant(s) being selected from a group containing boron B, sodium Na, calcium Ca, potassium K, and aluminum Al. Other embodiments provide a source material 200a which is a polymer, for example polynorbornene, polystyrene, polycarbonate, polyimide, or benzocyclobutene, or a metal or metal alloy.

The source material 200a may be provided as a powder, as glass frit, or may include glass pellets. According to another embodiment, the source material 200a is a flat piece, e.g. a disk with a flat working surface 201 arranged in contact with the mold substrate 100. According to an embodiment the source material 200a is a flat glass disk.

The source material 200a and the mold substrate 100 are pressed against each other. For example the source material 200a is provided on the working surface 101 of the mold substrate 100 and the source material 200a is pressed against the working surface 101. A temperature of the source material 200a and a force exerted on the source material 200a are controlled such that at least a portion of the source material 200a along the interface with the mold substrate 100 fluidifies. The source material may be fluidified before or during pressing. A plate 900 may be provided that presses the source material 200a towards the mold substrate 100.

For example, the source material 200a exhibits a glass transition and a force 905 exerted on the source material 200a and a temperature of the source material 200a are controlled to exceed its glass transition temperature in the course of pressing. According to another embodiment, the source material 200a is heated up beyond the glass transition temperature before a force 905 is exerted on the source material 200a. By exerting the force 905, the fluidified source material 200a flows into the cavity 102 and may fill at least an upper portion of the cavity 102 formed in the mold substrate 100. According to an embodiment the process of pressing is controlled such that fluidified source material 200a fills the cavity 102 completely. Then the force 905 exerted on the source material 200a and the temperature of the source material 200a are controlled in a way that the fluidified source material 200a re-solidifies.

Figure 1B:
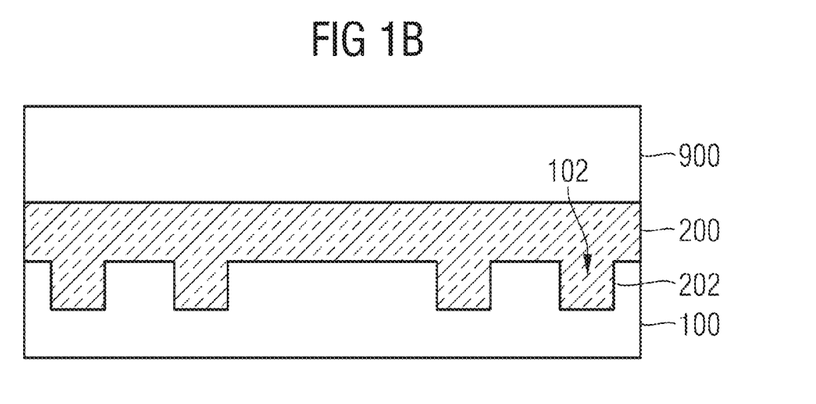
FIG. 1B is a cross-sectional view of the arrangement of FIG. 1A after fluidified source material has filled the rectangular cavities.

FIG. 1B shows the re-solidified source material forming a glass piece 200 with a protrusion 202 completely filling the cavity 102 in the mold substrate 100. According to an embodiment, the glass piece 200 may be in-situ bonded to the mold substrate 100 in the course of the pressing or the re-solidifying process such that the glass piece 200 and the mold substrate 100 forms a laminate or a bonded composite after re-solidifying of the source material 200a.

The plate 900 may be a single-crystalline material, for example a single-crystal semiconductor material. According to an embodiment, the plate 900 is made from single-crystalline silicon. The plate 900 may be bonded to the glass piece 200 during or after pressing to form a laminate or a bonded composite with the glass piece 200 and the mold substrate 100. According to another embodiment, another press medium is provided instead of the plate 900. According to other embodiments the plate 900 is made from a non-sticking material, for example a ceramic or a glass material different from the source material.

The mold substrate 100 is removed, for example using a combination of polishing methods like chemical mechanical polishing (CMP) and dry or wet etch methods which remove the material of the mold substrate 100 with high selectivity against the material of the glass piece 200. Also laser ablation is possible for removing the mold substrate 100. According to another embodiment, the mold substrate 100 or the source material 200a is provided with a non-sticking layer before bringing the source material 200a in contact with the working surface 101 of the mold substrate 100. Then the mold substrate 100 and the glass piece 200 may be separated from each other in a nondestructive way after re-solidification of the source material 200a.

The at least one cavity 102 of the mold substrate 100 may have a width of 10 micrometer or more and of 2 millimeter or less such that a glass piece 200 with protrusions 202 having a width from 10 micrometer to 2 millimeter may be formed. The heights of the protrusions 202 may be in the same range.

Figure 1C:
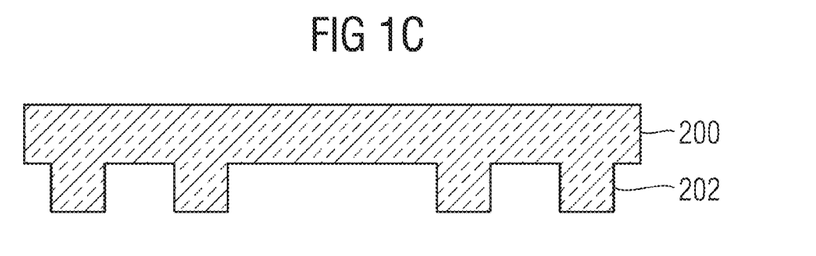
FIG. 1C is a cross-sectional view of a glass piece emerging from the process of FIG. 1B after removing the plate and the mold substrate.

FIG. 1C shows the glass piece 200 after removing the plate 900 and the mold substrate 100. Unevenness and impurities on the surface of the glass piece 200 can be removed with mechanical and/or chemical methods. The method provides glass pieces with a 3D patterned surface and showing no shrink as regards the pattern in the mold substrate used for the manufacture of semiconductor devices, such that glass pieces provide high mechanical, chemical and temperature stability, insulation strength and dielectric strength. The glass piece 200 may be used as a template or form in further processes.

According to another embodiment, one or more protrusions are formed in the working surface 101 of the mold substrate 100 and extend outward from the working surface 101, wherein the source material 200s and the mold substrate 100 are pressed against each other while a temperature of the source material 200a and a force exerted on the source material 200a are controlled such that fluidified source material enwraps the protrusion(s).

Figure 2A:
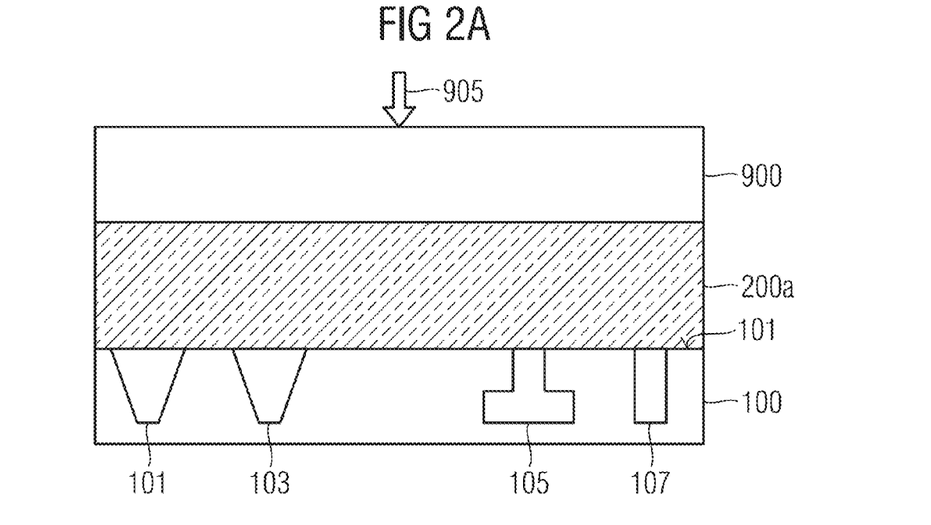
FIG. 2A is a schematic cross-sectional view of an arrangement including a mold substrate, a source material based on a glass and a plate for exerting a force on the source material for illustrating the manufacturing of a glass piece according to an embodiment using a mold substrate with cavities of different dimension and slope angles.

FIG. 2A shows a mold substrate 100 with a plurality of cavities 101, 103, 105, 107 that may differ in shape and size. For example, the mold substrate 100 may be made of single-crystalline silicon in which the cavities 101, 103, 105, 107 are etched using different etch processes. For example, cavities 101, 103 may be etched using a wet etch process which etches specific crystallographic surfaces at different etch rates such that the cavities 101, 103 have a certain slope angle with regard to the working surface 101. The slope angle may be 80 degrees or less, and may be more than 10 degrees, for example between 30 and 60 degrees. According to an embodiment the slope angle is about 45 degrees. Other cavities 105, 107 may be formed using an etch regime which is less selective as regards crystallographic surfaces, for example reactive ion etching such that cavities with steep slope angles greater 80 degrees, for example close to 90 degrees can be etched. Further, by filling a lower section of the cavity 105 with an auxiliary layer and depositing a collar-like mask in the upper section of the cavity 105, removing the auxiliary layer and controlling a further isotropic etch process may result in a bottle shape of the cavity 105.

By using different etch regimes/etching times for different sections of the mold substrate 100, cavities 101, 103, 105, 107 of different depths may be formed in the mold substrate 100.

A force 905 is exerted on a plate 900 that is arranged to press a source material 200a against the working surface 101 of the mold substrate 100. The force 905 and the temperature of the source material 200a are controlled such that at least some of the source material 200a fluidifies and fluidified source material 200a flows into and fills the cavities 101, 103, 105, 107 of the mold substrate 100. After filling the cavities 101, 103, 105, 107 the source material 200a re-solidifies.

Figure 2B:
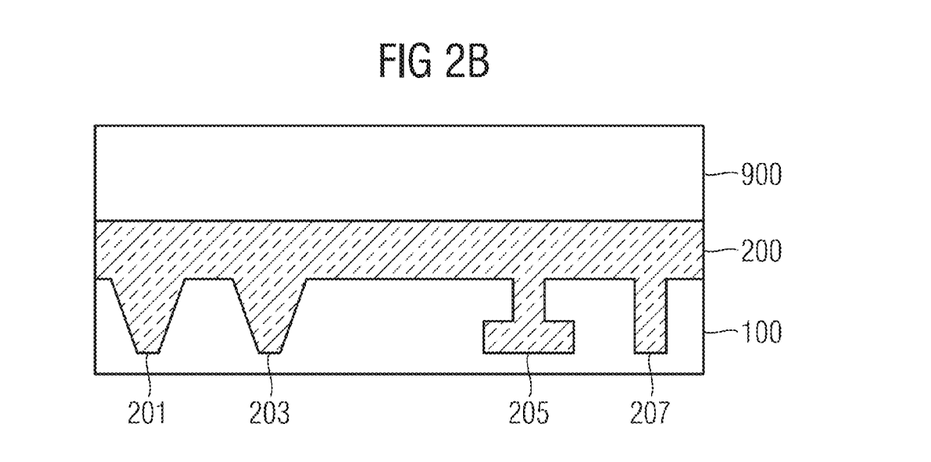
FIG. 2B is a cross-sectional view of the arrangement of FIG. 2A after fluidified source material has filled the cavities.

FIG. 2B shows the re-solidified source material 200a forming a glass piece 200 with protrusions 201, 203, 205, 207 defined by the cavities 101, 103, 105, 107 of the mold substrate 100. The glass piece 200 is in-situ bonded with the mold substrate 100 and may be in-situ bonded also with the plate 900, provided the plate 900 is made of a bondable material. The single-crystalline silicon of the mold substrate 100 is removed selectively against the material of the glass piece 200.

Figure 2C:
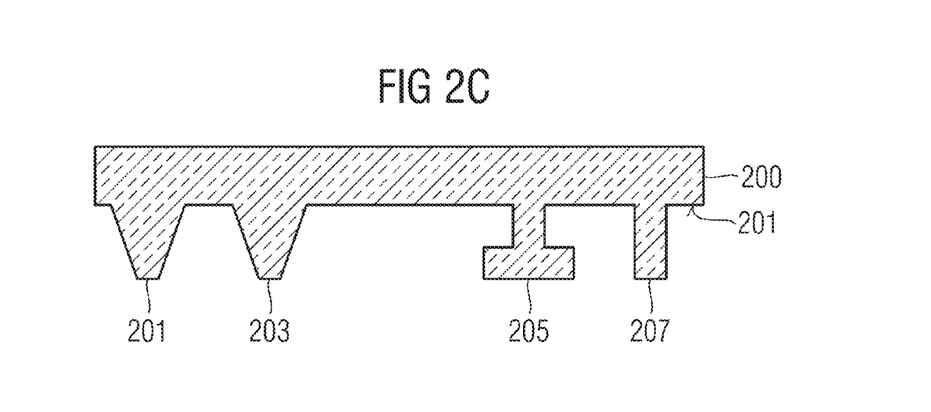
FIG. 2C is a cross-sectional view of a glass piece emerging from the process of FIG. 2B after removing the plate and the mold substrate.

FIG. 2C shows the resulting glass piece 200. The glass piece 200 comprises a patterned surface 201 in which at least one protrusion is formed which has a slope angle with regard to the patterned surface 201 of less than 80 degrees, for example between 40 and 50 degrees. According to an embodiment, the protrusion has a slope angle of 45 degrees with regard to the patterned surface 201. The scheme may be applied to protrusions on the mold substrate 100 accordingly.

According to an embodiment, on the working surface 201 at least a first 203 and a second protrusion 207 are formed, wherein the first and the second protrusion 203, 207 have slope angles which differ from each other by at least 5 degrees. According to another embodiment, the glass piece 200 has the first 203 and a third protrusion 201, wherein the heights of the first and the third protrusion 203, 201 over the working surface 201 differ by at least 20% of the lower one. The at least one protrusion 203 may have a height of 10 micrometer or more. According to an example, the at least one protrusion 203 has a height of 5 mm or less. The at least one protrusion 203 may have a width of 10 micrometer or more. According to further embodiments, the mold substrate 100 may comprise protrusions in addition to the cavities 102 such that in the glass piece 200 cavities are formed in addition to the protrusions 202. The embodiments provide a simple and reliable method for obtaining 3D patterned glass surfaces with pattern widths of less than 1 millimeter.

Figure 3A:
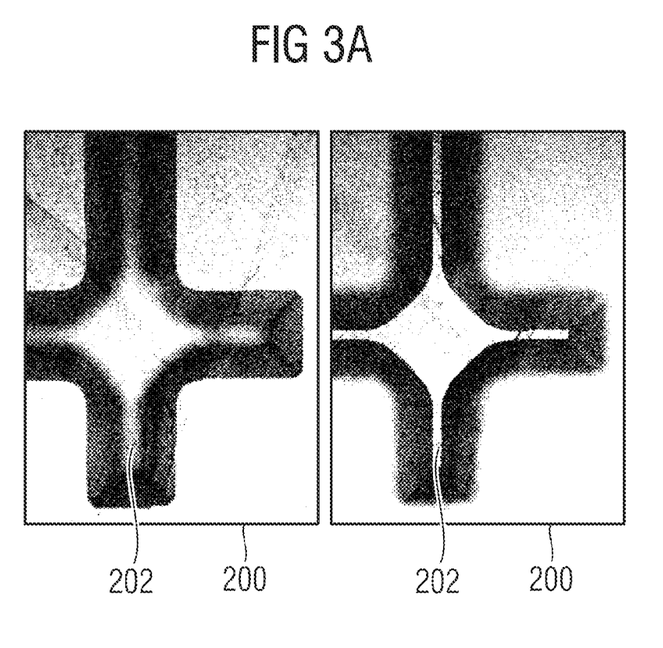
FIG. 3A shows photographic images of a plan view of a glass piece emerging from a method of manufacturing a glass piece according to an embodiment.

FIG. 3A shows a microscope image of a glass piece 200 emerging from the above-described method. The left image focuses the base of a protrusion 202 and the image on the right side focuses a top edge of the protrusion 202. The protrusion 202 is cross-shaped wherein the branches of the cross have a width of about 250 micrometers at the base and about 30 micrometers at the top. The height of the protrusion is 125 micrometers and the slope angle is about 45 degrees.

Figure 3B:
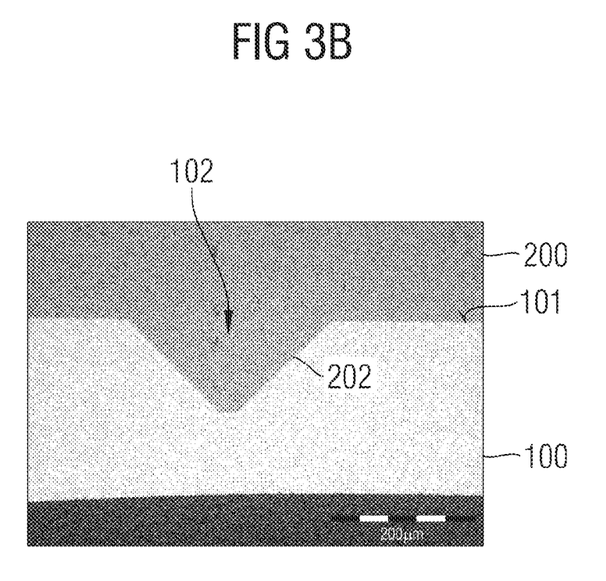
FIG. 3B is a polished cross-section image of an arrangement with a glass piece bonded to a single-crystalline silicon mold substrate according to a further embodiment.

FIG. 3B shows a cross-sectional image of a mold substrate 100, which is in-situ bonded to a glass piece 200 and which has a cavity 102 with a slope angle of about 45 degree with regard to a working surface 101. The re-solidified glass material of the glass piece 200 fills the cavity 102 completely, and the protrusion 202 of the glass piece 200 extending into the cavity 102 shows well-defined sidewalls and a slope angle corresponding to that of the cavity 102.

Figure 3C:
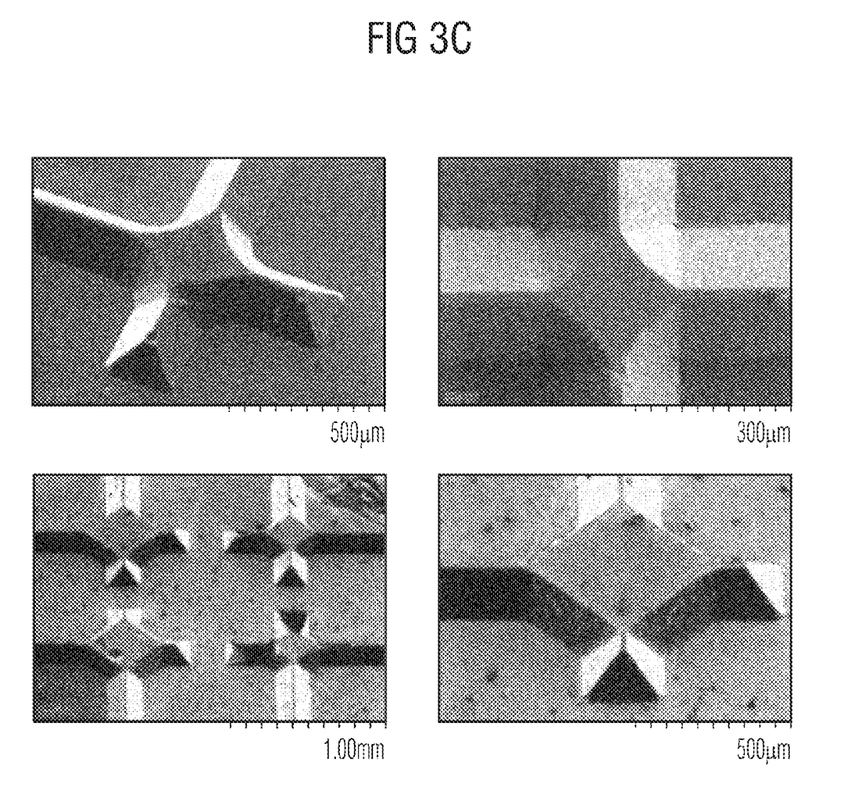
FIG. 3C shows scanning electron microscope images from a glass piece emerging from a method of manufacturing a glass piece according to a further embodiment.

FIG. 3C shows scanning electron microscope images from a glass piece emerging from a method of manufacturing a glass piece according to a further embodiment. Protrusions of different shape form a 3D pattern on a working surface of the glass piece.

Figure 4A:
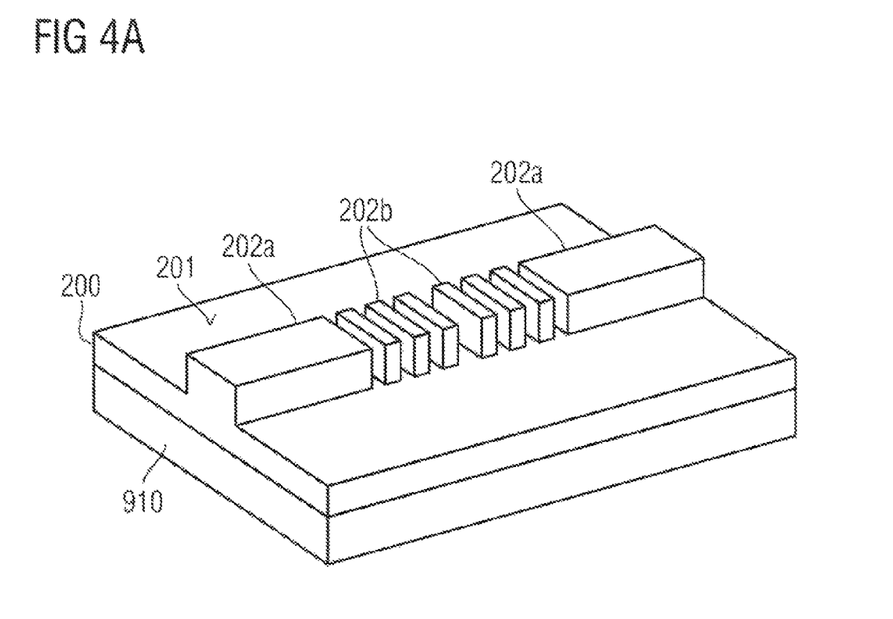
FIG. 4A is a schematic perspective view of a section of an optical integrated device according to a further embodiment.

FIG. 4A refers to an embodiment concerning the manufacture of integrated optical devices. The working surface of a mold substrate forms a three-dimensional template for a pattern on a working surface of a glass piece 200. The glass piece 200 is manufactured by arranging a source material based on a glass on a working surface of a mold substrate, which is made of a single-crystalline material. The mold substrate comprises a plurality of cavities. The source material is pressed against the working surface of the mold substrate. During pressing, a temperature of the source material and a force exerted on the source material are controlled to fluidify at least portions of the source material. Fluidified source material flows into the cavities. The source material is controlled to re-solidify, wherein the re-solidified source material forms the glass piece 200 with protrusions 202a, 202b. The protrusions 202a, 202b may form optical waveguides and further optical components on the working surface 201 of the glass piece 200. By a physical vapor deposition, suitable metals for mirror elements for integrated optical applications may be deposited on the glass piece 200.

FIG. 4A shows an example of an integrated optical device with the glass piece 200. On a working surface 201 of the glass piece 200 protrusions form optical waveguides 202a and an optical filter 202b. The glass piece 200 may be arranged on a carrier 910.

Figure 4B:
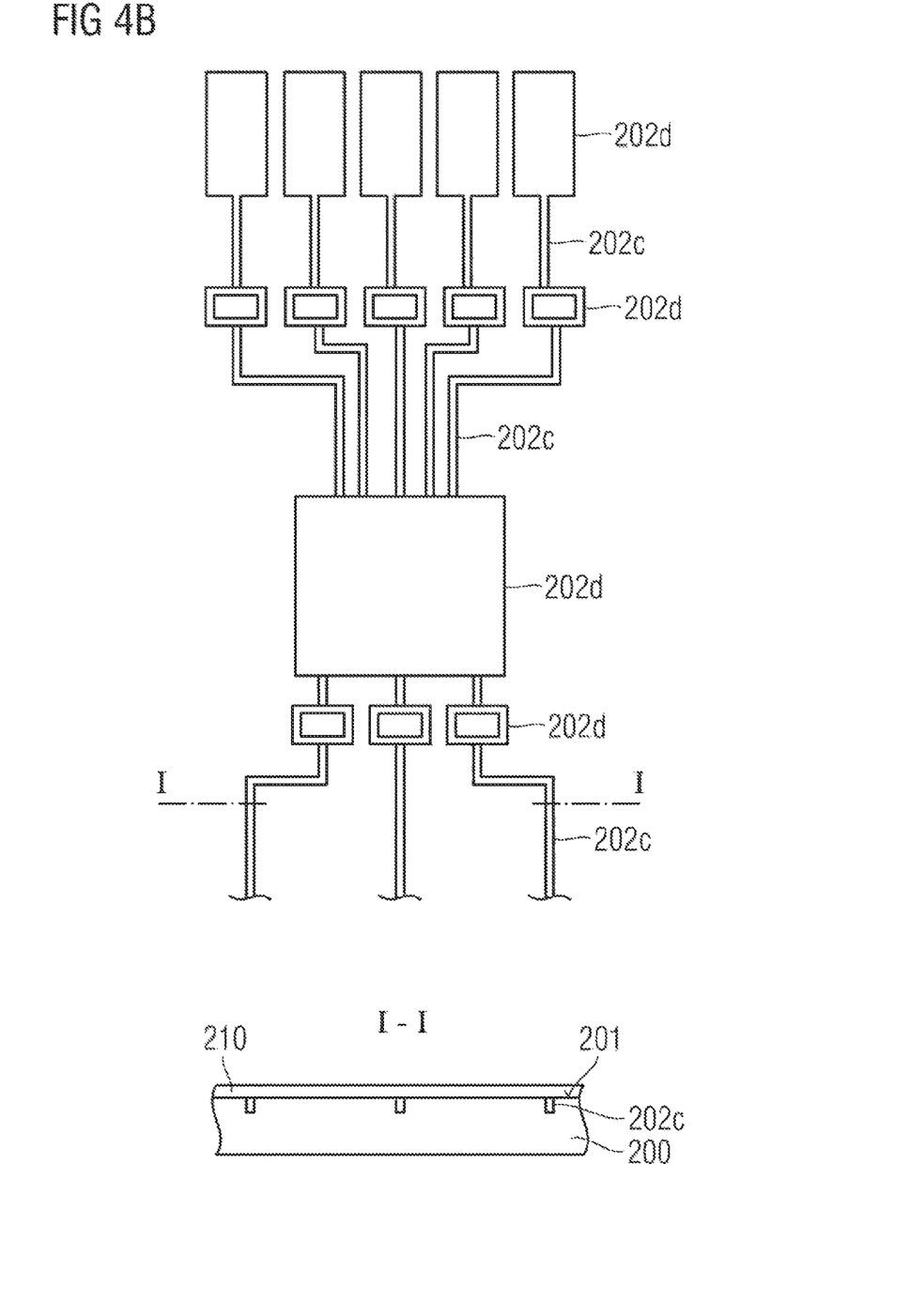
FIG. 4B is a schematic plan view of a micro fluidic device according to an embodiment.

FIG. 4B refers to an embodiment concerning the manufacture of micro fluidic devices. A source material, which is based on a glass, is arranged on a working surface of a mold substrate. The mold substrate is made of a single-crystalline material, for example single-crystalline silicon. A 3D pattern including protrusions and/or cavities is formed on the working surface. The source material is pressed against the working surface of the mold substrate. During pressing, a temperature of the source material and a force exerted on the source material are controlled such that at least a portion of the source material fluidifies and fluidified source material flows into cavities and fills the 3D pattern. The fluidified source material re-solidifies to form a glass piece 200 with a 3D pattern being the counterpart of the template formed by the 3D pattern on the working surface of the mold substrate. The glass piece forms a portion of a micro fluidic device. A cover substrate may be provided on the 3D pattern of the glass piece 200 to form channels from grooves of the 3D pattern. The channels are adapted to pass a fluid.

FIG. 4B shows a top view on a micro fluidic device including channels 202c and reservoirs 202d.

Figure 5A:
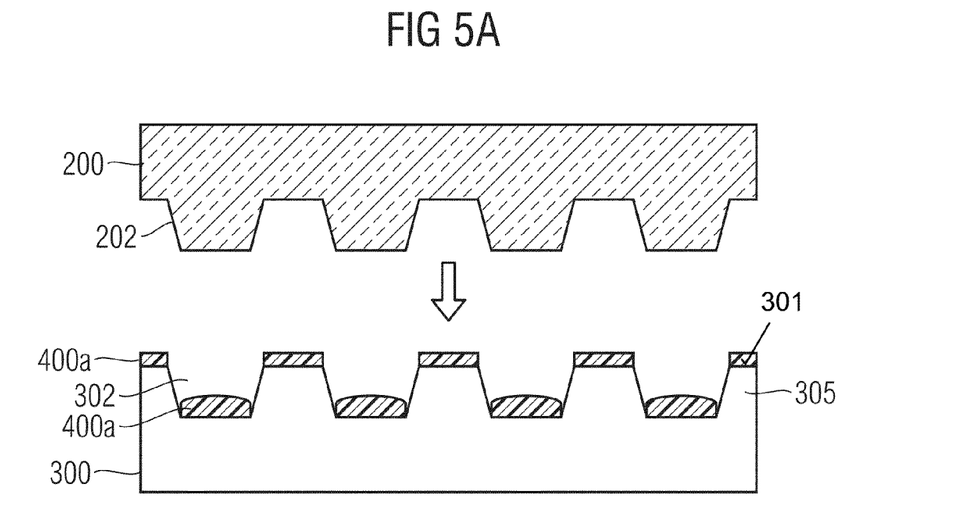
FIG. 5A shows a schematic cross-sectional view of a pre-patterned glass piece and a semiconductor substrate to illustrate details of an embodiment referring to the manufacture of a semiconductor device according to another embodiment.

FIG. 5A refers to a method of manufacturing a semiconductor device. A glass piece 200 is manufactured according to the methods as described in FIGS. 1A to 1C and 2A to 2C. In a working surface 301 of a semiconductor substrate 300 one or more cavities 302 is/are formed. A semiconductor element, for example a diode, a transistor, a field effect transistor or an IGBT is formed in a mesa portion 305 of the semiconductor substrate 300 outside the cavities 302. The semiconductor substrate 300 is brought in contact with a glass piece 200. The glass piece 200 has one or more protrusions 202 which are formed to match with and fit into the cavities 302. The glass piece 200 and the semiconductor substrate 300 are arranged such that the protrusions 202 extend into the cavities 302. Then, the glass piece 200 is bonded to the semiconductor substrate 300.

According to an embodiment an adhesive material 400a is provided between the semiconductor substrate 300 and the glass piece 200 before the bonding is performed. The glass piece 200 is adhesive bonded to the semiconductor substrate 300 through the adhesive material 400a. The adhesive material 400a may be a polymer. According to other embodiments, the adhesive material 400a is an inorganic material, for example BPSG (boron-phosphorous-silicate glass), glass solder, metal or metal alloys. The adhesive material 400a may be applied to the semiconductor substrate 300, to the glass piece 200 or to both. For example, the adhesive material 400a may be applied to cover the bottom of the cavities 302 or the tops of the mesa portion 305 or both.

Figure 5B:
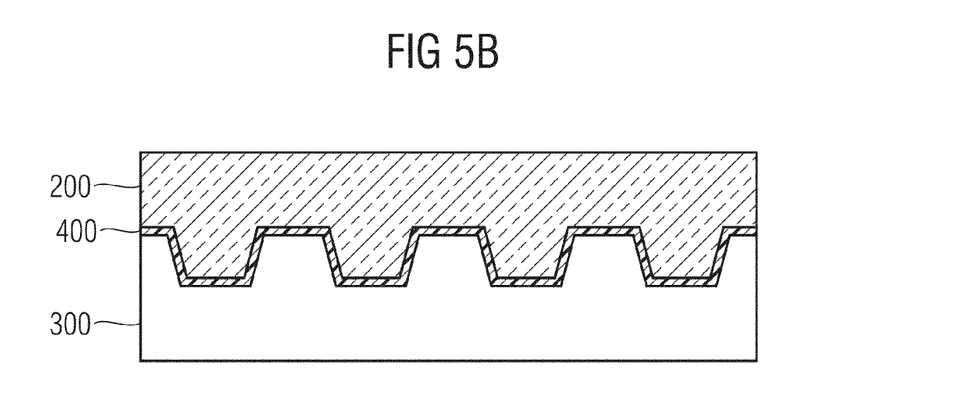
FIG. 5B is a simplified cross-sectional view of the glass piece and the semiconductor substrate of FIG. 5A after adhesive bonding.

FIG. 5B shows an adhesive layer 400 formed from the cured adhesive material 400a which adhesive bonds the glass piece 200 and the semiconductor substrate 300. According to another embodiment, the glass piece 200 is in-situ bonded to the semiconductor substrate 300 by pressing the glass piece 200 against the semiconductor substrate 300, wherein during the pressing a temperature of the glass piece 200 and a force exerted on the glass piece 200 are controlled to fluidify the glass material. The force and the temperature are controlled such that fluidified glass material re-solidifies. After re-solidifying the glass piece 200 is bonded to the semiconductor substrate 300 and the protrusions 202 completely fill the cavities 302 in the semiconductor substrate 300.

According to an embodiment the semiconductor substrate 300 is formed with a cavity 302 in the working surface 301 of the semiconductor substrate 300, wherein the cavity 302 has a width of at least 10 micrometers or a slope angle less than 80 degree, for example 45 degree with regard to the working surface 301 of the semiconductor substrate 300. For example, the protrusion 202 may form an edge isolator for integrated circuits, for example power MOSFETs, IGBTs (insulated gate bipolar transistors), diodes, transistors, logic circuits, driver circuits, processor circuits or memory circuits.

According to another embodiment, a cavity forming a grid is formed in the working surface 301 of a semiconductor substrate 300. The cavity extends along and within kerf areas, wherein a width of the cavity is wider than a width of the kerf areas. The glass piece 200 comprises a protrusion 202 that forms a grid and that matches with the grid formed by the cavity 302. The semiconductor substrate 300 is ripped or sawed after the bonding along the kerf areas to obtain a plurality of semiconductor dies from the semiconductor substrate 300. Each semiconductor die includes a glass frame emerging from the glass piece.

Figure 6:
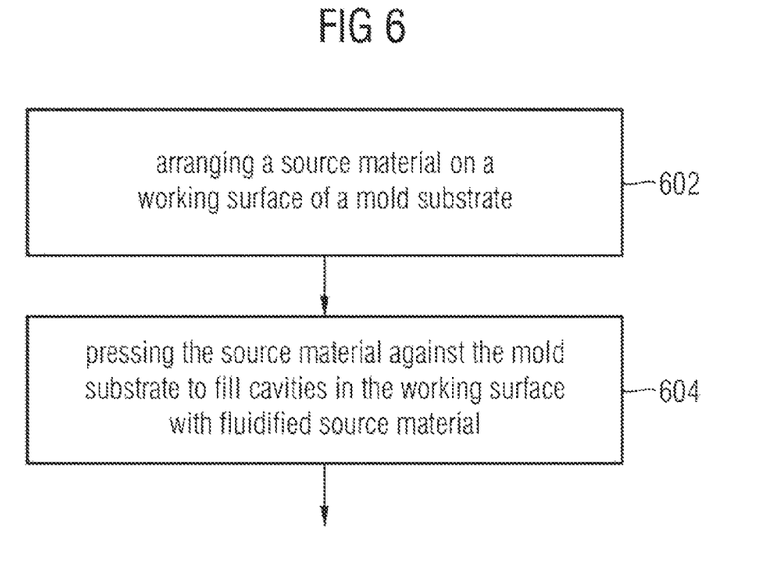
FIG. 6 is a simplified flowchart of a method of manufacturing a glass piece according to an embodiment.

FIG. 6 refers to a method of manufacturing a glass piece. A source material based on a glass is arranged in contact with a single-crystalline mold substrate having a cavity (Step 602). The source material is pressed against the mold substrate, wherein the source material fluidifies and fills the cavity (Step 604). The re-solidified source material forms a glass piece that may be in-situ bonded to the mold substrate.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   forming a semiconductor element in a mesa portion of a semiconductor substrate,
      wherein the semiconductor element is one of a transistor, a diode, a field effect transistor, an IGBT, a logic circuit, a driver circuit, a processor circuit and a memory circuit;
   forming a cavity in a working surface of the semiconductor substrate;
   bringing the semiconductor substrate in contact with a glass piece made of a glass material and having a protrusion, wherein the glass piece and the semiconductor substrate are arranged such that the protrusion extends into the cavity; and
   bonding the glass piece to the semiconductor substrate, wherein forming the glass piece comprises:
      forming a mold substrate of a single-crystalline material by etching a sharp-angled cavity into a working surface of the mold substrate;
      bringing a source material based on a glass in contact with the working surface provided with the sharp-angled cavity, wherein the source material is a powder, a glass frit, includes pellets, or is a disk with a flat surface; and
      pressing the source material and the mold substrate against each other, wherein if the source material is a disk, the disk is pressed with the flat surface against the working surface of the mold substrate, and wherein a temperature of the source material and a force exerted on the source material are controlled such that source material is fluidified and flows into the sharp-angled cavity,
      wherein the sharp angles of the sharp angled cavity are disposed below the working surface.

2. The method according to claim 1, further comprising providing an adhesive material between the semiconductor substrate and the glass piece before bonding, wherein the glass piece is adhesive bonded to the semiconductor substrate through the adhesive material.

3. The method according to claim 1, wherein the glass piece is in-situ bonded to the semiconductor substrate by pressing the glass piece against the semiconductor substrate, wherein during the pressing a temperature of the glass piece and a force exerted on the glass piece are controlled to fluidity the glass material.

4. The method according to claim 1, wherein the cavity in the working surface of the semiconductor substrate has a slope angle between 10 and 80 degrees, and the glass piece comprises a protrusion matching with the protrusion having a slope angle between 10 and 80degrees.

5. The method according to claim 3, wherein:
   the cavity in the working surface of the semiconductor substrate forms a grid, the cavity extending along and within kerf areas, wherein the cavity is wider that the kerf areas;

the glass piece comprises a protrusion forming a grid and matching with the grid formed by the cavity; the method further comprising:

separating, after the bonding, the semiconductor substrate in and along the kerf areas to obtain a plurality of semiconductor dies from the semiconductor substrate, each semiconductor die including a glass frame emerging from the protrusion of the glass piece.

6. The method according to claim 3, further comprising thinning, after the bonding, the semiconductor substrate from a rear side opposite to a front side defined by the working surface.

* * * * *

UNITED STATES PATENT AND TRADEMARK OFFICE
CERTIFICATE OF CORRECTION

PATENT NO. : 9,981,844 B2
APPLICATION NO. : 13/415376
DATED : May 29, 2018
INVENTOR(S) : A. Breymesser et al.

Page 1 of 1

It is certified that error appears in the above-identified patent and that said Letters Patent is hereby corrected as shown below:

In the Claims

Column 8, Line 45 (Claim 1, Line 34) please change "sharp angled" to -- sharp-angled --
Column 8, Line 57 (Claim 3, Line 6) please change "fluidity the" to -- fluidify the --
Column 8, Line 62 (Claim 4, Line 5) please change "80degrees" to -- 80 degrees --
Column 8, Line 66 (Claim 5, Line 4) please change "wider that" to -- wider than --

Signed and Sealed this
Twenty-second Day of January, 2019

Andrei Iancu
*Director of the United States Patent and Trademark Office*